United States Patent [19]
Wohlmut et al.

[11] 3,946,367
[45] Mar. 23, 1976

[54] THREE DIMENSIONAL ELECTRO-OPTICAL RETRIEVAL SYSTEM

[75] Inventors: Peter G. Wohlmut, Palo Alto; Frank D. Neu, Castro Valley, both of Calif.

[73] Assignee: Videonics of Hawaii, Inc., Honolulu, Hawaii

[22] Filed: May 22, 1974

[21] Appl. No.: 472,080

Related U.S. Application Data

[63] Continuation-in-part of Ser. No. 316,661, Dec. 20, 1972.

[52] U.S. Cl. .................. 340/173 LM; 340/173 LT; 179/100.41L
[51] Int. Cl.² ........................................ G11C 13/04
[58] Field of Search............ 179/100.3; 340/173 LM

[56] References Cited
UNITED STATES PATENTS

| | | | |
|---|---|---|---|
| 3,518,442 | 6/1970 | Johnson | 179/100.41 L |
| 3,626,386 | 12/1971 | Feinleib | 340/173 LM |
| 3,820,087 | 6/1974 | Chaudhari | 340/173 LM |

*Primary Examiner*—Terrell W. Fears
*Attorney, Agent, or Firm*—Lyon & Lyon

[57] ABSTRACT

A system for sensing information located in tracks in various layers or depths of a recording medium. The desired information is electro-optically tracked in three dimensions to provide sensing of the information contained in the multi-layered recording medium.

19 Claims, 18 Drawing Figures

THREE DIMENSIONAL ELECTRO-OPTICAL RETRIEVAL SYSTEM

BACKGROUND OF THE INVENTION

This is a continuation-in-part of application Ser. No. 316,661 filed Dec. 20, 1972.

This invention relates to electro-optical systems which track information on a multi-layered or multi-depth recording medium to provide an output of the information contained in the recording medium. More particularly, the system relates to the continuous playback of audio/video information for home and professional use. This system is especially compatible with individual home black and white, or color television sets, utilizing the sets to continuously display the information contained in the multi-layered recording medium.

Electro-optical technology which records and retrieves information on two dimensional recording medium, such as conventional film or rotating discs, is well known in the art. However, many prior art electro-optical devices which deal with high density or high frequency information are hampered by the problems of the accuracy of placement of a pick up head, or the like, and synchronizing different types of information. Further, to achieve electro-optically a continuous playback with accuracy for a substantial length of time, a great amount of two dimensional recording medium is required.

By recording information in an electro-optical form in two dimensions on a medium, in any of a number of conventional manners, and by stacking the resulting recordings, it will be apparent that storage density will dramatically increase if a reliable electro-optical system for retrieving this information can be provided.

Assuming that the recording medium used is a conventional rotating plate which consists of discs stacked one on top of the other, it is apparent that the recording density on any disc need not be as great (e.g., for a stack of five discs it may be approximately five times less) as in present systems. With a spiral like track or a plurality of tracks recorded on each disc, in any form such as digital or analog, an electro-optical unit can be provided as described herein which can electrooptically track and electro-optically sense each and every layer and follow any desired track thereupon to achieve sensing and playback, or retrieval, of the information. This information may be discretely retrieved from a particular location in the multi-layered medium or may be continuously retrieved from each and every layer of the medium.

The ability to select a layer or depth from which information is to be retrieved allows the first information layer to be located below the surface of the plates thus making the system insensitive to dirt located on the surface of the plate.

Thus, the electro-optical retrieval of information, especially continuously, in a stack of two dimensional recording medium or recorded at various depths in a single medium will provide a reasonable playing time in a relatively small volume of the recording medium.

By the practice of this invention, information may be continuously retrieved in a reasonable playing time and in three dimensions with a high degree of accuracy.

The advantages inherent in a three-dimensional electro-optical retrieval system may be realized by providing a preferred embodiment of this invention a multi-layered recording medium which contains information. The image of the data plane of interest is projected by a lens means having a depth of field less than the separation between alternative data planes to a detector means. A sensing electro-optical system which includes the lens means and detector means is thereby either electro-optically focused on the projected image of the desired information or the image is focused on the detector. A tracking electro-optical system tracks the desired information located in the recording medium in the lateral and normal (or depth) directions, and thereby controls the positioning and focusing of the sensing system on the desired information. Tracking in the third dimension on a given track is achieved by the desired track passing the tracking and sensing electro-optical systems or by both electro-optical systems scanning to compensate for the relative motion between the systems and the desired track.

SUMMARY OF THE INVENTION

It is an object of this invention to provide electro-signal track following in three dimensions.

It is also an object of this invention to provide a system for electro-optically retrieving information in three dimensions.

It is another object of this invention to provide an accurate electro-optical retrieval system for continuously tracking and sensing information from a multi-layered recording medium.

It is a further object of this invention to achieve an electro-optical retrieval system which results in a reasonable playing time with a relatively small volume of recording medium.

It is still a further object of this invention to provide an electro-optical retrieval system to track and sense desired information in radial and normal directions in a multi-layered recording medium or in a medium having information recorded at different depths.

It is still another object of this invention to provide a three dimensional retrieval system including a lens means having a depth of field less than the separation between alternative data planes.

BRIEF DESCRIPTION OF THE DRAWINGS

The invention both as to its organization and principles of operation together with further objects and advantages thereof may better be understood by referring to the following detail description of an embodiment of the invention when taken in conjunction with the accompanying drawings in which.

DESCRIPTION OF THE PREFERRED EMBODIMENT

Figure 1:
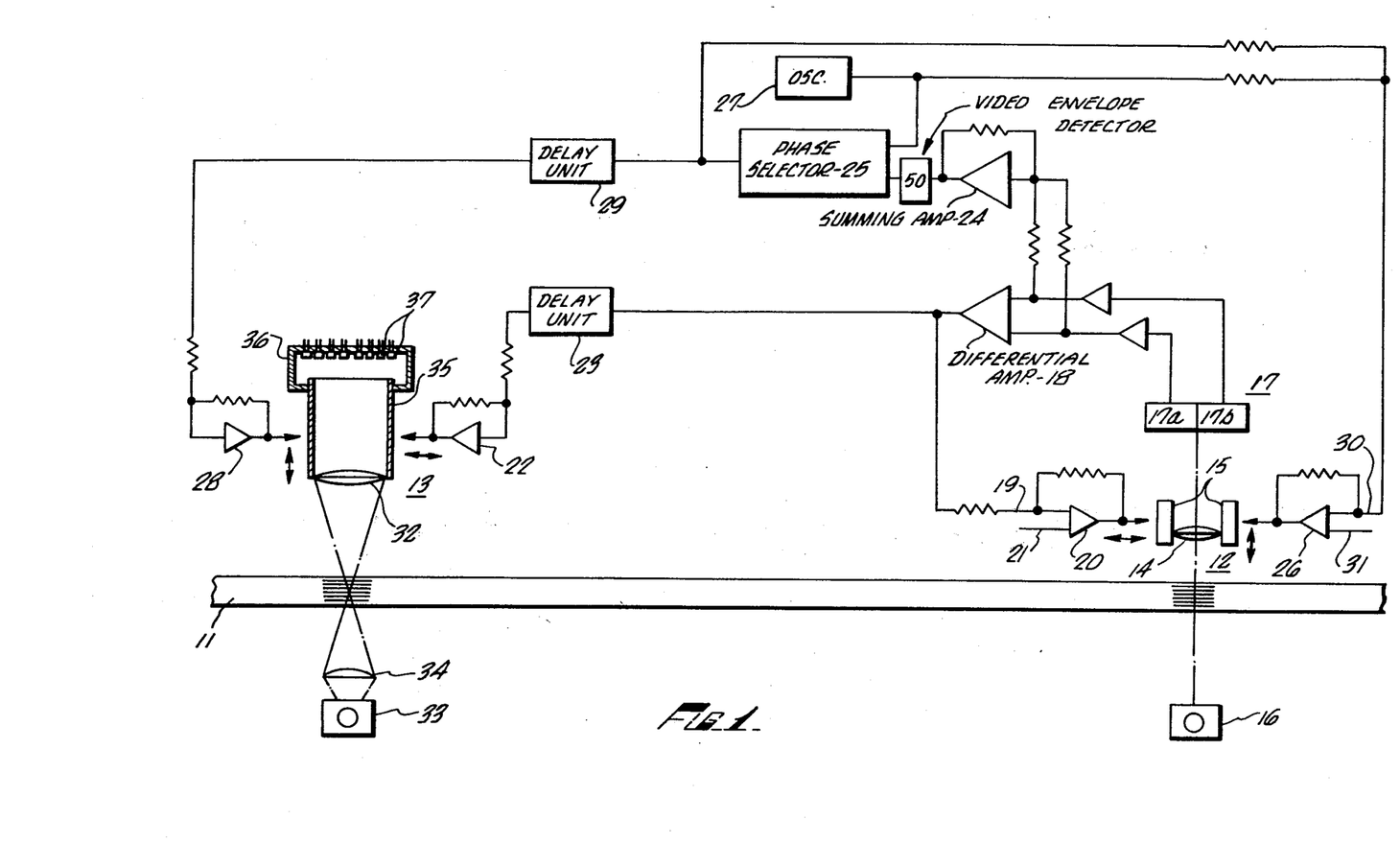
FIG. 1 is a block diagram illustrating an exemplary embodiment of the basic concepts of a three dimensional electro-optical retrieval system for a multi-layered recording medium in accordance with this invention.

Referring now to FIG. 1, a multi-layered recording medium or plate 11 in the form of a plurality of discs (only a small segment of which is shown) is illustrated to contain tracks of information on a plurality of its layers. In this embodiment, plate 11 is capable of being driven so that the desired information will pass a first adjustable electrooptical system 12 at a first time and pass a second adjustable electro-optical system 13 a predetermined time thereafter. Electro-optical system 12 follows an information track on a given layer or disc of plate 11, and controls positioning of the electrooptical system 13 which retrieves information. The plate 11 may also be in the form of a single disc which includes information recorded at various depths therein.

Electro-optical system 12 is utilized to electro-optically focus and track the desired information in the lateral and normal or depth directions and includes a lens 14 which is adjustable in the lateral and normal directions by control apparatus 15. The lens 14 has a generally short focal length, i.e. a fraction of a centimeter, and a large enough numerical aperture to provide a depth of field less than the separation between alternative data layers or planes of plate 11.

A microscope objective, for example Tiyoda P171755 20x lens with a numerical aperture 0.40 operated without a cover glass is satisfactory. Control apparatus 15 may be of any readily available design or combination of designs such as the type utilizing speaker type coils in a permanent magnetic field to electromagnetically change the position of the lens 14 to a selected focal plane. Control apparatus 15 is a two axes positionable lens system. The axes of motion are, (1) in the disc plane transverse to the track in a direction along a disc radius; and (2) perpendicular to the track and the disc itself. The control apparatus 15 controls the lateral and vertical position of lens 14 which in turn focuses the desired image plan on the split photodetector 17.

The light source 16 positioned beneath the plate 11 in the first electro-optical system 12 emits light and floods the general area of the desired information on plate 11 through lens 14, or other focusing equipment, to a light responsive unit such as a photosensor or split photodetector 17. The light from the source 16 need not be carefully focused on the desired information. This is in distinction to many prior art systems which require exact focusing on the desired information in the recorded medium. A split photodetector 17 is utilized in a preferred embodiment but its equivalents, such as a pair of positioned light responsive resistors, semi-conductors, photomultipliers, or the like, will suffice.

The split photodetector 17 comprises halves 17a and 17b. Each half provides an output signal representative of the amount of light impinging upon its surface from the light source 16 as the desired information in disc 11 moves past the photodetector 17. The outputs of the split photodetector 17 are connected, through amplifiers, as inputs to a differential amplifier 18 which in turn is connected through its output to a first input of a servo amplifier 20. The output of differential amplifier 18 is also connected to a servo amplifier 22, through a delay unit 23, to position the second electrooptical system 13 in the lateral direction after a predetermined time delay as will be described subsequently. Servo amplifier 20 which controls the lateral positioning of the lens 14 through control apparatus 15, is also provided with a second input 21 to allow a coarse setting of the control apparatus 15 and thus a coarse positioning of the first electro-optical system 12 in the lateral direction.

Lateral positioning of the first electro-optical system 12 and the second electro-optical system 13 (after a delay) is thus achieved by the relative amount of light striking halves 17a and 17b of split photodetector 17. Due to the positioning of the split photodetector 17, halves 17a and 17b receive the same amount of light when the first electro-optical system is properly positioned (i.e. straddling the information track) on the desired information. When equal amounts of light strike halves 17a and 17b, the output of the differential amplifier 18 will be zero, and thus no signal is provided to the input 19 of servo amplifier 20 and the position of lens 14 as controlled by apparatus 15 is unaltered.

When halves 17a and 17b receive different amounts of light from light source 16, the input signals to the differential amplifier 18 likewise will be different. When this occurs, an output signal from the differential amplifier 18 will command, through servo amplifier 20, a correction of lens 14 in the appropriate lateral direction.

FIG. 1 is illustrative of a two head or lens system in accordance with this invention, i.e. a first electro-optical system 12 having a lens means 14 and a second electro-optical system 13 having a lens means 32. In the disclosed embodiment the first electro-optical system 12 is utilized to track in the lateral and in the normal directions. From this disclosure it is deemed evident that a three head system could be realized by providing separate electro-optical systems for the lateral tracking function and the normal tracking function of the first electro-optical system 12 and for the sensing function of the second electro-optical system 13. A one head or lens system in which a common lens means is utilized will be described when referring to FIGS. 10 and 11.

Having described the lateral tracking function of the first electro-optical system 12, the normal or depth tracking function of electro-optical system 12 will be discussed. The depth or normal tracking function of the first electro-optical system 12 utilizes lens 14, control apparatus 15, split photodetector 17, summing amplifier 24, video envelope detector 50, phase detector 25, servo amplifier 26 and oscillator 27. The outputs from halves 17a and 17b of split photodetector 17 are further connected through amplifiers, as inputs to the summing amplifier 24. The output of summing amplifier 24 is connected through the video envelope detector 50 to a first input to the phase detector 25. The output of phase detector 25 is connected to a servo amplifier 28 in the second electro-optical system 13 through a delay unit 29 and to a first input 30 of the servo amplifier 26 in the first electro-optical system 12. A second input 31 of servo amplifier 26 is provided to allow a coarse setting to be made of the control apparatus 15 in the normal direction.

Oscillator 27 provides a dither signal of a predetermined frequency such as 100 to 120 hertz to a second input of phase detector 25 and to the first input 30 of servo amplifier 26. The dither signal from the oscillator 27 applied to the first electro-optical system 12 causes the lens 14 to vibrate in the normal or depth direction at a frequency determined by the output of the oscillator 27.

The output of the phase detector 25 is applied to the first input 30 of servo amplifier 26 to ultimately retain the lens 14 at an average position (in the normal direction) to focus on the desired information. The phase detector 25 will not provide an output signal when the first electro-optical system 12 is focused at this average position in the normal direction and thus, the dither signal produced by oscillator 27 is free to alone cause equal excursions in the normal or depth direction of lens 14 through a true focus to the high and low focus, as will be explained in discussing FIGS. 6a through 6e.

The movement of the plate 11 in the desired track direction (or the scanning by the electrooptical systems 12 and 13 because of relative motion between the systems and the disc) and the positioning of the first electro-optical system 12 in the lateral and normal directions allow the second electro-optical system 13 to focus upon any desired information location and follow its track continuously.

The second adjustable electro-optical system 13, which finally sense or reads the desired information for retrieval thereof is, in effect, positioned and focused on the projected image of the desired information all in response to the first electro-optical system 12 after a predetermined time delay. Electro-optical system 13 is utilized to electro-optically focus on and sense the projected image of the desired information, and includes a lens 32 similar to lens 14, a second light source 33, a condenser lens 34, a housing 35, and a cap structure 36. The cap structure 36 may be a screw-on cap, and contains a plurality of photosensors, such as light responsive diodes 37, therein.

Light from source 33 floods the volume of interest and may be focused generally by a condenser lens 34 on the general area of the desired information. The light need not be carefully focused. The lens 32 focuses the projected image plane of the desired information on a detector means such as the light responsive diodes 37 in the cap structure 36.

Servo amplifier 28 controls the positioning in a normal direction of the second electro-optical system 13 by electromagnetically varying the position of the lens 32 or alternatively by changing the position of the diodes 37 to the correct focal plane by moving the cap 36 up and down with respect to the housing 35. Alternatively, the diodes 37 could be mounted in a diode holder or base (not shown), which is in turn connected to the cap 36. By moving the diode holder (not the whole cap) the diodes 37 could be moved in the focal plane thereby resulting in a light weight system.

The predetermined delay provided is the time it takes the information focused at a first time by the first electro-optical system 12 to travel to the second electro-optical system 13 and is provided by delay units 23 and 29. In the embodiment wherein the electro-optical systems 12 and 13 both are removed to scan in the desired track direction, this time is the period necessary for the second electro-signal system 13 to reach the desired information after the first electro-optical system 12 is focused thereon.

In operation, the first electro-optical system 12 is positioned to track the desired information in the lateral direction by the described circuitry and electro-optical equipment which attempts to center laterally the desired track. More specifically, when the track is centered properly, the light from source 16 falls equally on both halves 17a and 17b of the split photodetector 17 by the lens 14. When the light on half 17a and half 17b of the split photo-detector 17 is not equal, differential amplifier 18, through servo amplifier 19, will adjust the lateral position of the lens 14 through control apparatus 15 until both input signals from split photodetector 17 in differential amplifier 18 are equal. The action is a conventional servo action and will provide a proper input signal to servo amplifier 20 representative of the fact that the first electro-optical system 12 is properly centered in the lateral direction.

The first electro-optical system 12 also is positioned to track the desired information in the normal (or vertical as viewed in FIG. 1) direction, on the average. This is accomplished through the previous described circuitry and electrooptical equipment which in part, may be common with the lateral tracking function of the first electrooptical system 12. More particularly, the output of the phase detector 25 is applied to the servo amplifier 26 in such a manner to retain the lens 14 in focus (on the average) on the desired track image. This is accomplished by comparing in the phase detector 25 the output signal from the video envelope detector 50 with the dither signal from the oscillator 27 (as explained in more detail in conjunction with FIGS. 6a through 6e) and allowing the dither signal to cause equal excursions in the normal direction of lens 14 when average focus in the normal direction is achieved.

After a predetermined delay provided by delay units 23 and 29, the second electro-signal system 13 is positioned and focused in response to the position of the first electro-optical system 12 to sense the desired information either discretely or continuously. This three dimensional electrooptical retrieval system will thereby reduce the absolute centering requirements and the flatness requirements of the layers of recording medium sandwiched together to form a multi-layered disc.

Figure 2:
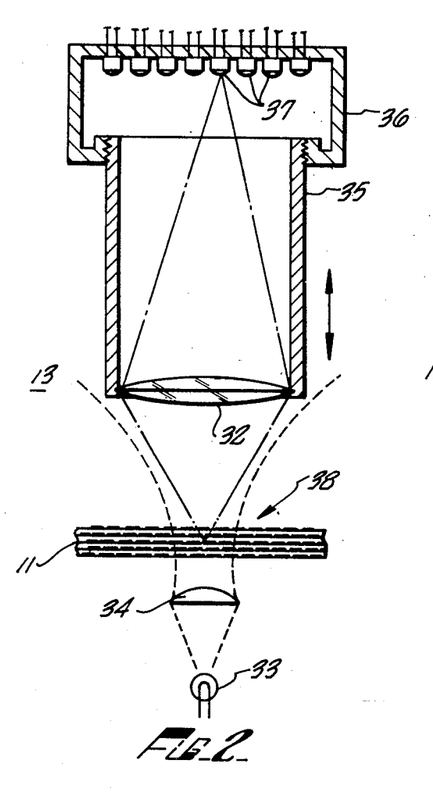
FIG. 2 is a diagram illustrating an embodiment of an electro-optical head utilized to sense information on a multi-layered recording medium in accordance with this invention.

FIG. 2 illustrates in greater detail a portion of the second electro-optical system 13. In this embodiment, the second light source 33 is generally focused through a condenser lens 34 and the plate 11 (only a small segment of which is shown). Plate 11 comprises a plurality of layers with some of the layers containing information 38 as will be explained subsequently in discussing FIGS. 7a, 7b and 7c. The image by the lens 32 through the housing 35 onto diodes 37 contained in the cap structure 36. The adjustability of this second electro-optical system 13 is accomplished through adjusting the lens 32 and/or adjusting the distance from lens 32 to the diodes 37 to properly focus the desired image plane on the detector means or diodes 37.

In operation, the light source 33 is generally focused through the condenser lens 34 onto the general area of the desired information layer. The lens 32 is then positioned to focus the projected image of the desired information onto the diodes 37. This enables the diodes 37 to receive an image indicative of the desired information on a particular layer. In FIG. 2, eight diodes are illustrated as being representative of detector means such as photosensors which sense binary information contained on the plate 11. For example, each layer of plate 11 may have a continuous information track which comprises a series of rows of binary coded spots, each row being eight bits wide as shown in FIG. 7a which will be described later. Although eight diodes are illustrated, the number and type of photosensor used in a matter of choice dictated by convenience and the type of information to be retrieved; for example, light sensitive integrated circuits (of the "bucket brigade" type) may be used. It is believed apparent that different types of detectors or photosensors may readily be matched with the type of recorded information utilized.

Further circuitry, which is well known in the art, may be added to the second electro-optical system 13 to increase the accuracy of the system as described. For example, such circuitry could compensate for non-linearities (such as subtracting the gray background, compensating for disc speed variations, etc.) or insure that the photosensors are properly retrieving the recorded information.

Figure 3:
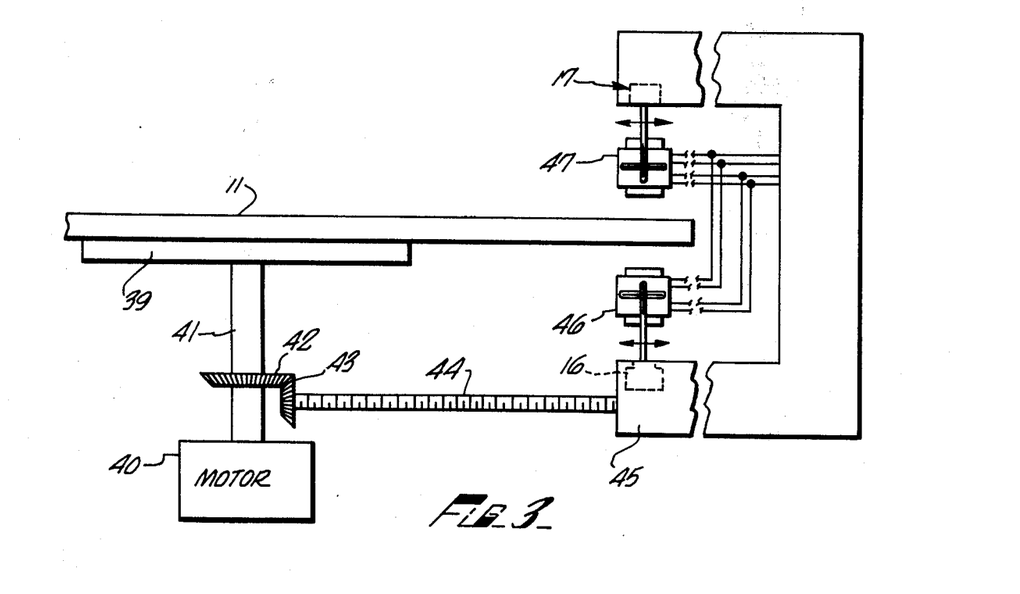
FIG. 3 is a side view of a two head system in accordance with this invention.

FIG. 3 illustrates a side view of a two head systems in combination with a section of a multilayered recording medium in the form of plate 11. Plate 11 is positioned on a turntable 39 which is driven by a motor 40 through a drive shaft 41. The drive shaft 41 has included thereon a gear member 42 which engages a coupling gear 43 to provide coarse following in the lateral direction through a mechanical linkage or lead screw 44. The other end of the lead screw 44 is connected to an outer casing 45 of the electro-optical system.

In the casing 45, the split photodetector 17 is located above the plate 11, and the light source 16 is located below the plate 11. Control units 46 and 47, which are positioned below and above the plate 11 respectively, contain electrical and optical equipment capable of following the desired track in the lateral and normal directions, as previously described.

Figure 4:
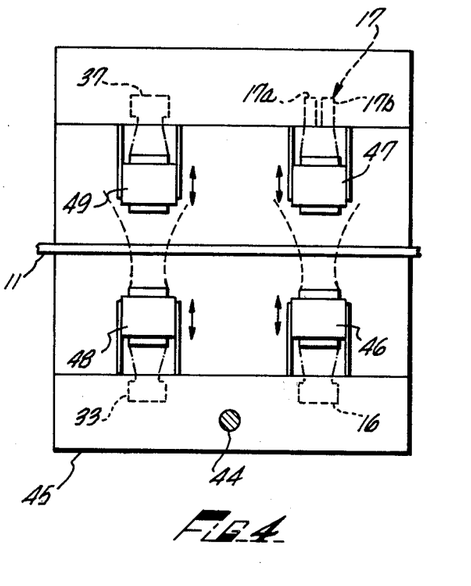
FIG. 4 is a front view of the two head system of FIG. 3 in accordance with this invention.

FIG. 4 illustrates a front view of the two head system of FIG. 3, including the photosensor 37 and the split photodetector 17 located above a section of the plate 11, in casing 45. The light from light source 33 in casing 45 is directed through lower control unit 48, the plate 11, and an upper control unit 49. The control units 48 and 49 are representativve of electrical and optical equipment which properly focuses on the desired information with respect to the photosensor 37. Likewise, the light from light source 16 in casing 45 is transmitted through control unit 46, plate 11 and control unit 47 to project an image of the selected data plane which in turn is focused on the split photodetector 17. Control units 46 and 48 may be eliminated if light sources 16 and 33 irradiate a sufficiently large area.

Figure 5A:
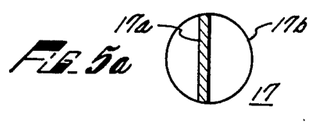
FIGS. 5a, 5b and 5c are representations of the light pattern on a split photodetector in accordance with this invention.

FIG. 5a illustrates a light pattern formed only on half 17a of the split photodetector 17. This pattern indicates that a correction in the lateral direction of the first electro-optical system 12 is required.

Figure 5B:
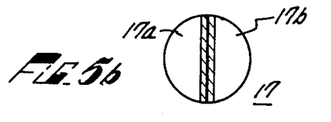

FIG. 5b illustrates a light pattern on split photodetector 17 in which the same amount of light impinges on both halves 17a and 17b. This pattern requires no correction since the desired information is properly being tracked, that is centered, in the lateral direction. Thus, when the desired track is centered equally in the lateral direction, both halves 17a and 17b of photodetector 17 receive the same amount of light.

Figure 5C:
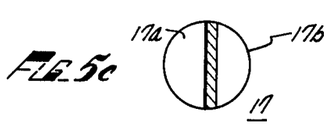

FIG. 5c illustrates a light pattern formed only on half 17b of split photodetector 17. This pattern indicates that an adjustment of the first electro-optical system 12 in the lateral direction is required. The direction of the lateral adjustment for FIG. 5c will be in the opposite direction as that required in FIG. 5a.

The light patterns of FIGS. 5a, 5b and 5c are illustrated as being of equal intensity, i.e. without taking into consideration the depth or normal direction focusing.

Figure 6A:
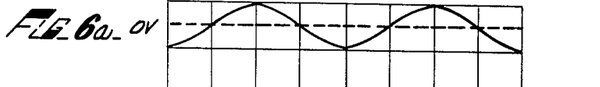
FIGS. 6a, 6b, 6c, and 6d and 6e are illustrations of various waveforms which occur in the electrooptical retrieval system in accordance with this invention.
Figure 6B:
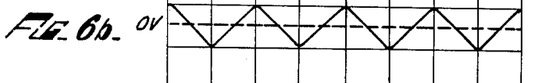
Figure 6C:
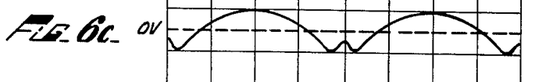
Figure 6D:
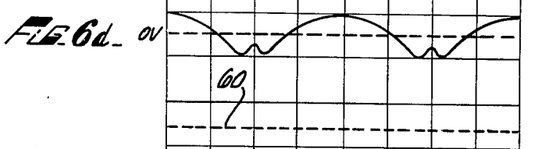
Figures 6E, 7A, 7B, 7C, 8, 9:
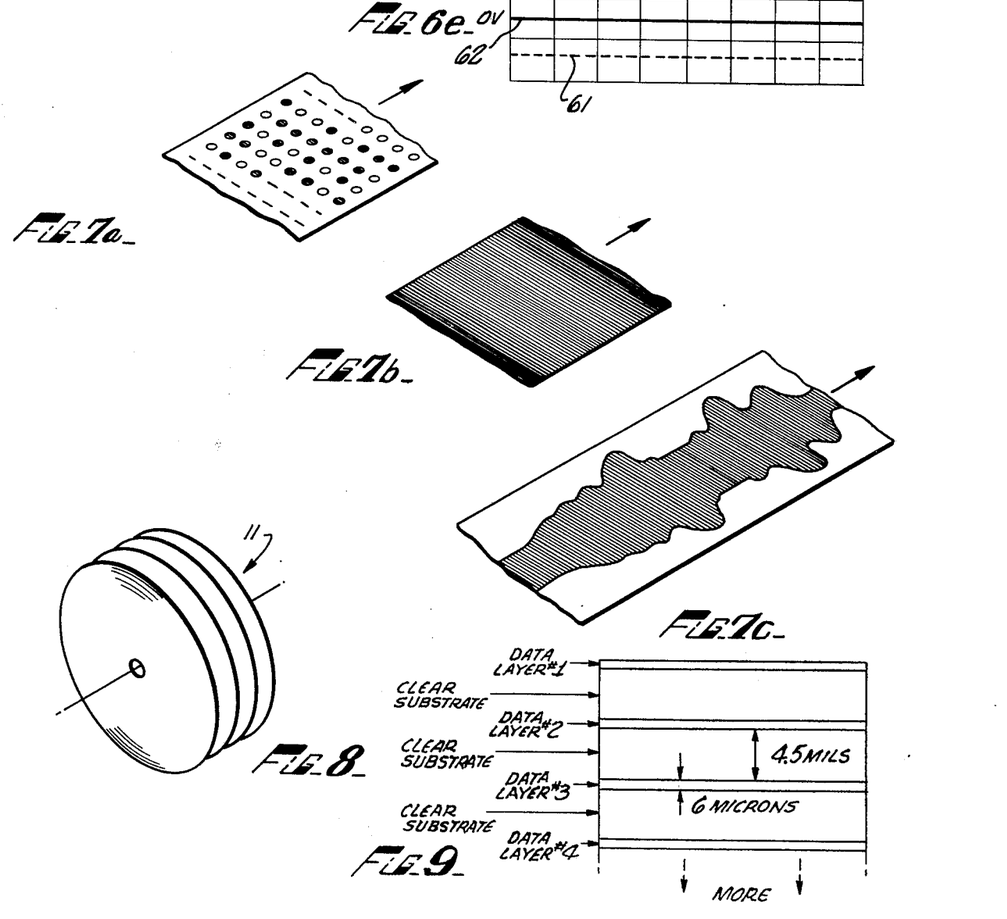
FIG. 7a illustrates a track of a recording medium with binary representation thereon.
FIG. 7b illustrates a track of a recording medium with a series of varying density bands thereon.
FIG. 7c illustrates a track of a recording medium with varying width opaque lines therein, all in accordance with this invention.
FIG. 8 illustrates a perspective view of an embodiment of a multi-layered recording medium in disc form, in accordance with this invention.
FIG. 9 illustrates a side view of a multi-layered recording medium, in accordance with this invention.

The waveforms of FIGS. 6a – 6e illustrate the operation of tracking in the normal or depth direction of the first system 12. The waveform of FIG. 6a illustrates the dither signal, produced by the oscillator 27, which exclusively causes the first electro-optical system 12 to vibrate in the normal or depth direction when the image of the desired information is in focus in the normal or depth direction, on average. Zero voltage corresponds to an average image height and positive voltage corresponds to a higher than average image height. The waveform of FIG. 6a is also fed to an input of the phase detector 25, as was previously mentioned.

The waveform of FIG. 6b illustrates the output of the video envelope detector 50 when the image of the desired information is properly focused in the normal or depth direction on the average. This is achieved when the image of the desired layer of information is, on the average, between the high and low focus points of the vibrating lens 14. The downward direction in FIGS. 6b, 6c and 6d indicates better focus.

The waveform of FIG. 6c illustrates the output of the video envelope detector 50 when the image of the desired information is out of focus in the normal direction, too high on the average.

The waveform of FIG. 6d illustrates the output of the video envelope detector 50 when the image of the desired information is out of focus in the normal direction, too low on the average.

The phase detector 25 receives two input waveforms, the waveform or dither signal, of FIG. 6a from oscillator 27 and one of the waveforms of FIG. 6b, 6c, or 6d. When the phase detector 25 receives the waveform of FIG. 6a and the waveform of FIG. 6c, indicative of lens 14 focusing the desired image plane on the detector means too high on the average, the phase detector 25 will generate, as an output signal, waveform 60 of FIG. 6e. The waveform 60 of FIG. 6e is transmitted to input 30 of the servo amplifier 26 to cause lens 14 to focus lower. indicative of lens 14 focusing the desired image plane on the detector means in focus in the normal direction on the average, the phase detector 25 will not generate an output, as represented by the zero volt waveform 62 of FIG. 6e.

Thus the output of the phase detector 25 ultimately effects the positioning of lens 14, in its normal or depth tracking mode, to retain the average position of the lens 14 in a position which will focus the desired image plane on the detector means. When proper focus is reached, the dither signal causes equal excursions of the lens 14 through true focus, to high and low focus.

FIG. 7a illustrates a single track of information including a series of eight binary information bits. Information is retrieved from the track of FIG. 7a by diodes which respond to discrete binary codes with the outputs of the diodes connected by a digital-to-analog converter to produce video signals. FIG. 7b illustrates a single track of information including a series of varying density bars, such as bars of approximately fifty different densities. Information is retrieved from the track of FIG. 7b by diodes or an elongated sensor which provides an analog output proportional to the density of each bar, but effecting the amplitude of the lines. FIG. 7c illustrates a single track of information including a varying width opaque line. In FIG. 7c, the information is retrieved like in FIG. 7b. FIGS. 7a, 7b and 7c are not exhaustive of the types of information which readily recorded on each layer of a multi-layered recording medium. Also, the first video line (i.e. top TV raster scan line) may be coded in a manner to distinguish the same. A signal representing this line can be used to identify each TV field or frame and correct the track's system in the event the latter deviates from the proper track. Likewise, a coded signal at horizontal retrace time can be used to cause the electro-optical system to switch from one track to the next.

It is believed apparent that the recording of information on different layers of a multi-layered medium may require the recorded information to be of variable densities which will be electro-optically distinguishable, but which will not prevent light from a source reaching the appropriate photosensors. There are presently available over fifty different densities which may be utilized in the practice of this invention.

FIG. 8 illustrates a plurality of layers in the form of thin discs, (for example 10), each individual disc being constructed of a plastic or the like to comprise the plate 11. For example, each layer may be made from a photographic film with a clear polyesther substrate and a thin silver halide emulsion forming the data plane. A master is recorded, and copies are printed therefrom. The individual layers then are bonded together with a clear adhesive or in some other way, such as ultrasonically. The bonding may cause variations in the thickness between the layers or bends in the plate, but in a preferred embodiment of this invention, the normal or depth tracking system removes the effects of these.

In the embodiment of FIG. 8, the disc radius is approximately seven inches and the thickness of each disc is approximately 4.5 mils. A stack of five discs has a total thickness of approximately 25 mils; however, upper and lower cover discs and/or a rigid or massive rim can be used to enable better support. Using 5,000 convolutions per inch (forming one continuous track as in a phonograph record, or 5,000 separate tracks) over a four inch band of the disc radius, and 1/30th of a second to scan each convolution track, approximately 60 minutes playing time for color video can be provided (which utilizes a four megahertz bandwith). A lineal speed of approximately 10 meters per second appears to be the maximum required.

Each layer typically has a single track in the form of convolutions as noted above. When the end of the track on one layer is reached, a recorded coded signal causes the electro-optical system to focus on the track of the next layer. This coded signal could be in the form of a step charge in voltage to achieve coarse correction through a servo amplifier. Typically a layer change (which takes about 12 to 18 milliseconds) occurs every twelve minutes in a color recording. The layer change could be accomplished by allowing the program to have a "fade out" or use other type of pictures, known in the art, to reduce the short flicker of the change. Alternatively, the electronics could replay the last view a second time. Also, two separate playback systems could be placed on opposite sides of the plate with each system focused on a different layer, and electronically alternatively switched on at the end of each layer. A layer change would then take only a few microseconds.

It is considered apparent that the recording medium need not be in the shape of a disc. The same type of track can be recorded on a drum, or on a web (like a film strip) which is stored in a cassette-type package. A drum, or cylinder, recording medium may be formed by recording on a continuous sheet or strip, and then winding this into a cylindrical form. A medium having information recorded at various depths (not in a layered form) or a medium having circular tracks (not a continuous spiral) may also be utilized in the practice of this invention.

FIG. 9 illustrates a side view of a recording media having four data layers or planes numbered 1 through 4 and separated by three clear substrates. The data such as that illustrated when referring to FIGS. 7a, 7b or 7c may be contained in each and any of the data layers and a protective layer (not shown) may be included on the top or bottom of the extreme plane or data layers. Each clear substrate is formed of a polyester and is shown as being 4.5 mils thick. Each data plane shown as being 6 microns thick is disposed on its respective substrate and formed of a photographic emulsion such as a high resolution grade emulsion. Each disc layer, e.g. the clear substrate and its associated data layer is affixed to other layers by means such as bonding.

As described previously, when light is flooded on the general volume of interest in the disc, image planes corresponding to the data of each of the data layers or planes are projected and the desired image plane is detected or read by a detector means. This is all accomplished by use of an electro-optical means which detects information from a specific data plane utilizing a lens means having a depth of field less than the separation between alternate data planes. For example, if the system desired to sense the information, i.e. the data of data layer number 2, the associated electro-optical means would include a lens means having a depth of field less than the separation between the lower portion of data layer number 1 and the upper portion of data layer number 3.

Figure 10:
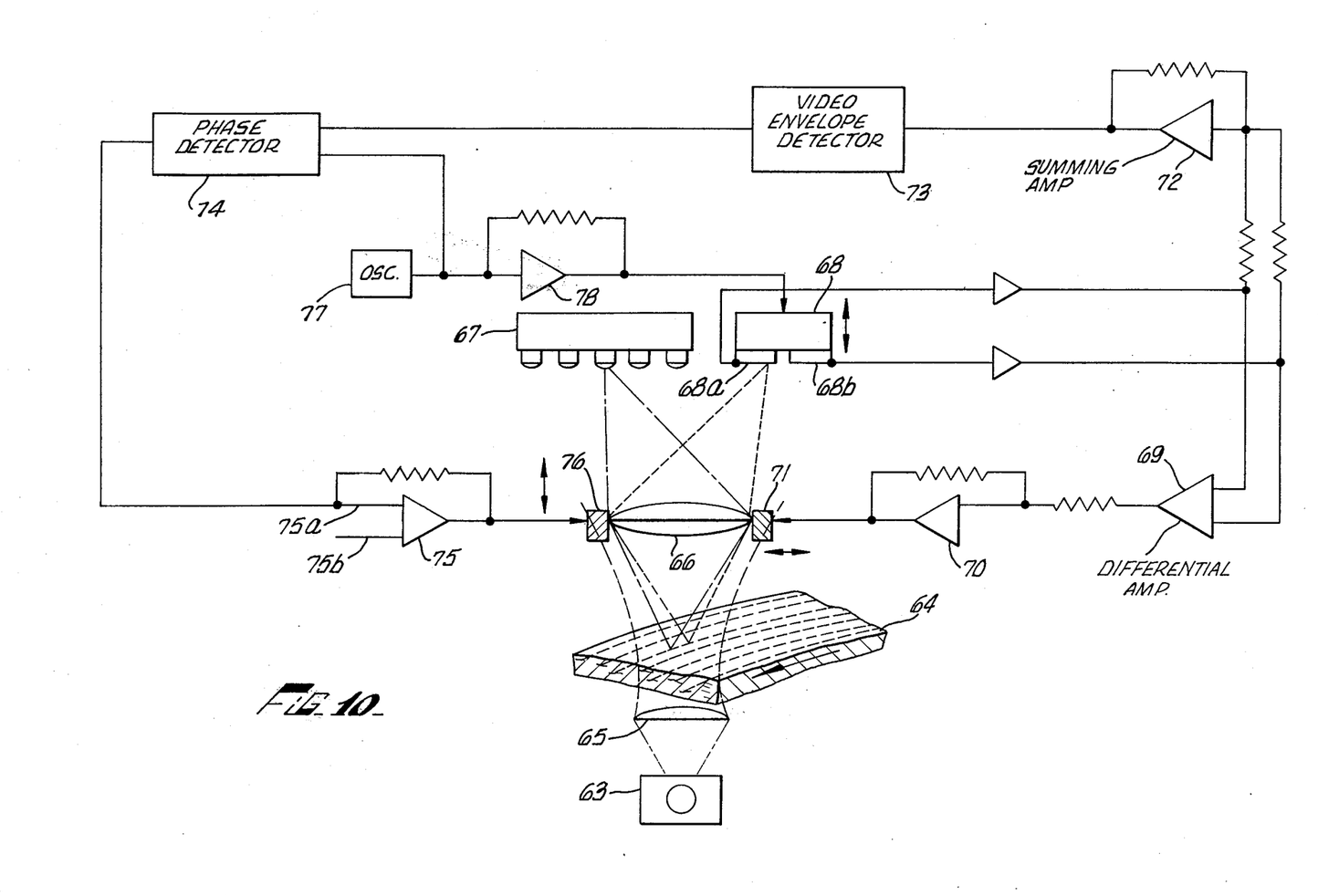
FIG. 10 is a block diagram illustrating another embodiment of the basic concepts of a three dimensional electro-optical retrieval system for a multi-layered recording medium in accordance with this invention.

Referring now to FIG. 10, there is illustrated an embodiment of this invention in which a three dimensional electro-optical system is depicted utilizing only a single lens. A source 63 emits radiation in the form of light and floods the general area of the multi-layered plate 64 (shown in perspective) which contains the desired information. The light from source 63 may be generally focused by lens 65 through the desired area of interest but there is no requirement that the lens 65 is exactly focused on the information in the data plane of interest.

The flooded light passing through the general area of interest causes the projection of image planes corresponding to the various data planes. The appropriate information on a portion of the desired image plane is focused by a lens means such as lens 66 on a detector means such as detector 67. The lens 66 is of the type described when referring to lenses 14 and 32 of FIG. 1 and has a depth of field less than the separation between alternate data planes. The detector means 67 may be any type of detector suitable for detecting the focused image from the projected image plane. For example, the detecting means may be of the photosensor type as illustrated in FIG. 1.

Disposed above the lens 66 is a split photodetector 68 which is analogous to the split photodetector 17. Halves 68a and 68b of the photodetector 68 each provide an output signal representative of the amount of light impinging upon its surface. The split photodetector 68 provides lateral tracking in the manner previously described by tracking information on the desired projected image plane corresponding to the desired data plane. The split photodetector 68 has been illustrated as being positioned to the side of detector 67 for the sake of illustration only. The motion for the tracks of plate 64 comes out of the drawing. Hence, in practice the photodetector 68 is actually positioned behind the detector 67 all in line with the desired track of the plate 64.

The remaining components in FIG. 10 are also analogous to those described in FIG. 1. However, in this embodiment, the same lens is used for both the tracking and reading function and faster responding servo mechanisms are utilized. The tracking and focusing servos must respond rapidly enough that the track image does not deviate or defocus beyond the tolerance limits of the detection system. Also, as will be explained subsequently, the embodiment of FIG. 10 accomplishes depth or normal focusing by dithering the photosensor 68 rather than dithering the lens 14 as done in FIG. 1. By dithering the photosensor 68, undesirable effects of dither introduced on the recovered signal are substantially eliminated in a single lens system.

Lateral tracking is achieved by connecting the outputs of the split photodetector 68, through amplifiers, as inputs to a differential amplifier 69. The differential amplifier 69 is, in turn, connected through its output to a servo amplifier 70. Amplifier 70 is in turn connected to a control unit 71 which positions the lens 66 in the proper lateral direction in the manner described when referring to FIG. 1 or by use of other positioning apparatus well known in the art.

As to normal or depth tracking, the outputs from halves 68a and 68b of the split photodetector 68 are connected through amplifiers to inputs of a summing amplifier 72. The output of the summing amplifier 72 is connected through a video envelope detector 73 to a first input of a phase detector 74. The output of the phase detector 74 is connected to a first input 75a of a servo amplifier 75. A second input 75b of the servo amplifier 75 is provided to allow a coarse setting of control unit 76 in the normal direction.

An oscillator 77 provides a dither signal of a predetermined frequency such as 100 to 120 hertz to a second input of the phase detector 74 and to a servo amplifier 78. The output of the servo amplifier 78 is connected to the split photodetector 68 and causes the split photodetector 68 to vibrate in the normal or depth direction at a frequency determined by the output of th oscillator 77. Thus, the split photodetector 68 is dithered with respect to information on the desired image plane in a manner analogous to the dithering of lens 14 in FIG. 1. Lens 66 is thereby positioned in the normal direction through the control unit 76.

Figure 11:
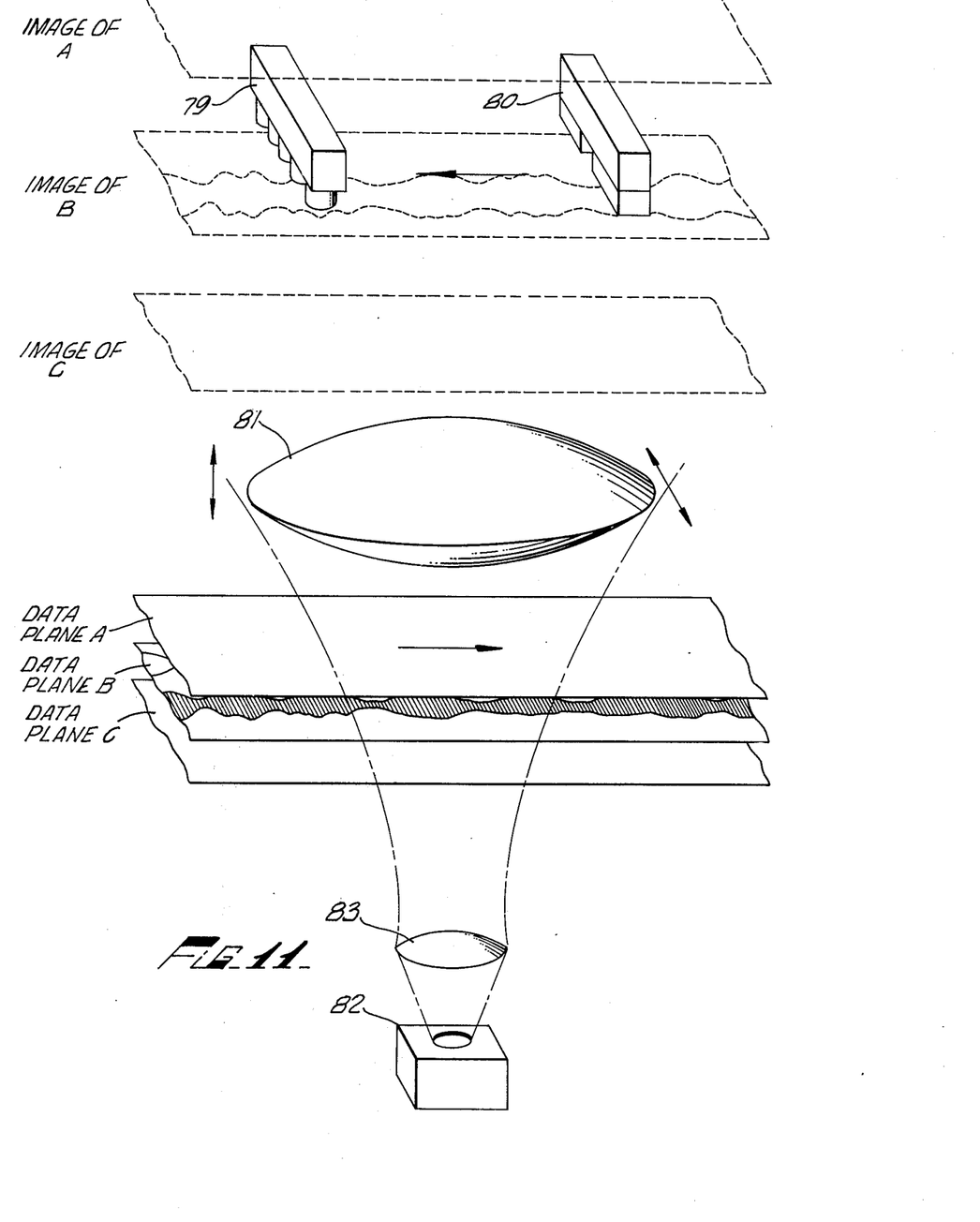
FIG. 11 is a diagram illustrating another embodiment of an electro-optical head including various data and image planes, utilized to sense information on a multi-layered recording medium in accordance with this invention.

Referring now to FIG. 11, there is illustrated a view in perspective of a plate traveling in the direction indicated by its associated arrow, made up to three data planes indicated by the letters a, b and c. Each of the data planes contain information. However, only the data in layer b is shown since, for illustrative purposes, that is the layer desired to be read by the detector 79 and tracked by the split photosensor 80. Disposed above the plate is a microscope lens 81 which has a depth of field less than the separation between alternate data planes, i.e. between data planes a and c. Three phantom lined image planes corresponding to data planes a, b and c are indicated as the image of a, image of b and image of c respectively.

In operation, a light source 82 is generally focused through a lens 83 on the area of interest to flood that area with light. A portion of the formed image layer corresponding to the desired data layer is projected by the microscope lens 81, in focus, to the detector 79.

The position of the lens 81 is controlled in both the lateral and the depth directions in a manner to allow the projection of the desired image plane to be in focus with respect to the detector 79. This is accomplished in a variety of manners such as using a stationary lens and a moving detector 79, using a moving recording media and a stationary lens and detector, or using a moving lens and a stationary detector. It is believed apparent that other techniques are encompassed in this invention with the criteria being that the desired image plane of the desired data plane is projected in a manner which allows the detecting means to read the information of the same, all done in combination with a lens means having a depth of field less than the separation between alternate data planes.

By providing an electro-optical system capable of accurately tracking desired information in three dimensions, information may be sensed and retrieved in a multi-layered recording media thereby achieving a reasonable playing time with a relatively small volume of recording media.

Track direction following is achieved by the movement of the recording media past the electro-optical system or systems or the electro-optical systems traveling in the direction of the track. Lateral or radial tracking is accomplished by utilizing a split photodetector or the like and a differential amplifier to correct the lateral position of the image. Depth of normal tracking is accomplished by vibrating a lens or the split photodetector in the normal direction and comparing a total amount of light sensed by a split photodetector with a dither signal from an oscillator to correct the position of a lens in the normal direction.

While embodiments and applications of this invention have been shown and described utilizing both a single lens and a two lens system, it will be apparent to those skilled in the art that many more modifications are possible, such as other types of detecting means and other combinations for focusing the projected image, all without departing from the inventive concept herein described. The invention therefore is not to be restricted except as is necessary by the prior art and by the spirit of the appended claims.

We claim:

1. An electro-optical retrieval system for retrieval of information from any one of a plurality of layers of a recording medium and of the type wherein relative motion is imparted between the recording medium and pick-up means for causing said information to be scanned for retrieval thereof, comprising means for receiving an information containing multi-layered recording medium, said recording medium having at least two adjacent layers each of which comprises an optically transparent substrate and optically readable data thereon in the form of a data track and a surrounding area, and electro-optical pick-up means for retrieving information selectively from any one of said layers, said electro-optical means including light source means exterior to said recording medium for flooding with light the general area of interest of at least two adjacent layers of said multi-layered recording medium, detector means and lens means for focusing an image of an area of a selected layer of said recording medium onto said detector means, the image so focused comprising a portion of the data track and surrounding area of the selected layer, said lens means having a short focal length providing a depth of field less than the thickness of two adjacent substrates to enable focusing of the data track between adjacent substrates of said recording medium, and control means for causing said focusing of the data track from a selected layer of said recording medium through said lens means onto said detector means.

2. A system as in claim 1 including
means for imparting relative motion between the recording medium and the electro-optical pick-up means comprising means for moving the recording medium past said electro-optical means.

3. A system as in claim 1, wherein
said detector means includes both a data detector and a tracking detector for respectively retrieving data from a selected layer and for tracking a data track of the selected layer, and
said control means includes means for laterally positioning said electro-optical means for tracking the selected data track.

4. A system as in claim 3 wherein
said tracking detector includes a split photosensor.

5. A system as in claim 3 wherein
said data detector includes plural light sensitive detectors.

6. A system as in claim 1 wherein
said control means includes means for dithering said lens means in a direction normal to the plane of said recording medium.

7. A system as in claim 3 wherein
said control means includes means for dithering said tracking detector in a direction normal to the plane of said recording medium.

8. A system as in claim 1 wherein
said lens means includes a lens for focusing an image of a portion of the data track from a selected layer of said recording medium onto said detector means, and
said control means includes electro-mechanical positioning means for moving said lens in a direction substantially parallel to the plane of said recording medium, and includes electro-mechanical positioning means for moving said lens in a direction normal to the plane of said recording medium.

9. A system as in claim 1 wherein
each said substrate of a layer of said recording medium has a thickness of approximately four and one half mils and the data layer thereon has a thickness of approximately six microns.

10. A system as in claim 9 wherein
said lens means has a depth of field less than approximately nine mils.

11. A system as in claim 9 wherein
said recording medium includes three adjacent layers $a$, $b$ and $c$ in order, each of which comprises an optically transparent substrate and optically readable data thereon in the form of a data track and a surrounding area, and
said lens means has a depth of field less than approximately nine mils to cause data of layers $a$ and $c$ to be out of focus while focusing an image of an area of data layer $b$ onto said detector means.

12. A system as in claim 1 wherein
said lens means includes a single lens for focusing an image of an area of a selected layer of said recording medium onto said detector means, and said detector means provides both information for tracking the data track of the selected layer and retrieving the data from the data track of the selected layer.

13. A system as in claim 12 wherein
said detector means includes both a data detector and a tracking detector for respectively retrieving data from the data track of a selected layer and for tracking the data track of the selected layer, and
said control means includes means for providing signals for laterally positioning said lens means for tracking the data track of the selected layer.

14. A system as in claim 13 wherein
said control means includes means for dithering said tracking detector in a direction normal to the plane of said recording medium.

15. A system as in claim 12 wherein
said control means is responsive to tracking information from said detector means for positioning said lens in a direction normal to the plane of the recording medium for focusing an image of a portion of a data track of a selected layer of said recording onto said detector means.

16. An electro-optical retrieval system for retrieval of information from any one of a plurality of layers of a recording medium and of the type wherein relative motion is imparted between the recording medium and pick-up means for causing said information to be scanned for retrieval thereof, comprising means for receiving an information containing multi-layered recording medium, said recording medium having at least two adjacent layers each of which comprises an optically transparent substrate and optically readable data thereon in the form of a data track and a surrounding area, and electro-optical pick-up means for retrieving information selectively from any one of said layers, said electro-optical means including light source means exterior to said recording medium for flooding with light the general area of interest of plural adjacent layers of said multi-layered recording medium, and detector means and lens means for focusing an image of an area of a selected layer of said recording medium onto said detector means, the image so focused comprising a portion of the data track and surrounding area of the selected layer, said lens means having a short focal length providing a depth of field less than the thickness of two adjacent substrates to enable focusing of the data track between adjacent substrates of said recording medium, said detector means deriving from said focused image information for tracking the data track of the selected layer and for retrieving data from the data track of the selected layer, and said lens means including positioning means responsive to said tracking information from said detector means for laterally positioning said lens means for tracking the selected data track, and including means for positioning said lens means in a direction normal to the plane of the recording medium for causing the focusing of the image of an area of the selected layer of said recording medium.

17. An electro-optical retrieval system for retrieval of information from any one of a plurality of layers of a recording medium and of the type wherein relative motion is imparted between the recording medium and pick-up means for causing said information to be scanned for retrieval thereof, comprising means for receiving an information containing recording medium, said recording medium having at least first, second and third adjacent layers each of which comprises an optically transparent substrate and optically readable data thereon in the form of a data track and a surrounding area, and electro-optical pick-up means for retrieving information selectively from any one of said layers, said electro-optical means including light source means exterior to said recording medium for flooding with light the general area of interest of adjacent layers of said multi-layered recording medium, detector means for receiving an image of an area of a selected layer of said recording medium and providing tracking information for tracking a selected data track and retrieving data from the selected data track, lens means for focusing the image onto said detector means, the image so focused comprising a portion of the data track and surrounding area of the selected layer, said lens means comprising a lens having a short focal length providing a depth of field less than the separation between data tracks of alternate layers of said recording medium, and control means responsive to said detector means, and including positioning means responsive to said tracking information from said detector means for laterally positioning said lens means for tracking the selected data track, and including means for positioning said lens means in a direction normal to the plane of the recording medium for causing the focusing of the image of an area of the selected layer of said recording medium.

18. A system as in claim 17 wherein said detector means includes an information detector, and includes a tracking detector leading the information detector for providing said tracking information, and said control means includes means for dithering said tracking detector.

19. A system as in claim 18 wherein the data on each substrate is formed of a photographic emulsion on a surface of the substrate, and said lens has a depth of field less than approximately 9 mils.

* * * * *